United States Patent
Suzuki

(10) Patent No.: US 7,355,156 B2
(45) Date of Patent: Apr. 8, 2008

(54) SOLID-STATE IMAGE PICKUP DEVICE, IMAGE PICKUP UNIT AND IMAGE PROCESSING METHOD

(75) Inventor: Nobuo Suzuki, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 39 days.

(21) Appl. No.: 10/834,010

(22) Filed: Apr. 29, 2004

(65) Prior Publication Data

US 2004/0262493 A1 Dec. 30, 2004

(30) Foreign Application Priority Data

May 8, 2003 (JP) .................... P. 2003-130413

(51) Int. Cl.
- H01L 27/00 (2006.01)
- H01L 31/062 (2006.01)
- H01L 31/00 (2006.01)
- G01J 3/50 (2006.01)
- H04N 3/14 (2006.01)

(52) U.S. Cl. ............ 250/208.1; 250/226; 257/291; 257/440; 348/294

(58) Field of Classification Search ........... 250/208.1, 250/226; 257/440, 290–294, 431, 432, 435, 257/443; 348/302, 294, 311
See application file for complete search history.

(56) References Cited

U.S. PATENT DOCUMENTS

| | | | | |
|---|---|---|---|---|
| 4,758,883 A | * | 7/1988 | Kawahara et al. ....... | 348/222.1 |
| 6,437,307 B1 | * | 8/2002 | Bloss et al. ............. | 250/208.1 |
| 6,469,290 B1 | * | 10/2002 | Suzuki .................... | 250/208.1 |
| 6,573,937 B1 | * | 6/2003 | Nakashiba ................ | 348/314 |
| 6,642,494 B1 | * | 11/2003 | Endo ........................ | 250/208.1 |
| 6,783,900 B2 | * | 8/2004 | Venkataraman ............... | 430/7 |
| 6,838,651 B1 | * | 1/2005 | Mann ....................... | 250/208.1 |
| 2002/0027189 A1 | * | 3/2002 | Murakami et al. ....... | 250/208.1 |

FOREIGN PATENT DOCUMENTS

| JP | 2000-69491 A | | 3/2000 |
|---|---|---|---|
| JP | 2000-316163 | * | 11/2000 |
| JP | 2000-316163 A | | 11/2000 |
| JP | 2001-238126 | * | 8/2001 |
| JP | 2001-238126 A | | 8/2001 |

* cited by examiner

Primary Examiner—Thanh X. Luu
Assistant Examiner—Pascal M Bui-Pho
(74) Attorney, Agent, or Firm—Birch, Stewart, Kolasch & Birch, LLP

(57) ABSTRACT

A solid-state image pickup device comprising a semiconductor substrate, and a plurality of photoelectric conversion elements arranged on a surface of said semiconductor substrate both in a line direction and in a column direction perpendicular to the line direction to form a tetragonal lattice, wherein: said photoelectric conversion elements include a plurality of high-sensitive photoelectric conversion elements for performing photoelectric conversion in relatively high sensitivity, and a plurality of low-sensitive photoelectric conversion elements for performing photoelectric conversion in relatively low sensitivity; and said plurality of high-sensitive photoelectric conversion elements and said plurality of low-sensitive photoelectric conversion elements are arranged so as to be shaped like a checkered pattern.

51 Claims, 4 Drawing Sheets

SOLID-STATE IMAGE PICKUP DEVICE, IMAGE PICKUP UNIT AND IMAGE PROCESSING METHOD

FIELD OF THE INVENTION

The present invention relates to a solid-state image pickup device including a semiconductor substrate, and a plurality of photoelectric conversion elements arranged on a surface of the semiconductor substrate both in a line direction and in a column direction perpendicular to the line direction to form a tetragonal lattice.

BACKGROUND OF THE INVENTION

In a solid-state image pickup device used in a digital camera, it is generally difficult to widen the dynamic range of image because electric charges corresponding to image signals are detected by photoelectric conversion elements (hereinafter also referred to as "pixels"). Therefore, use of a solid-state image pickup device having relatively high-sensitive photoelectric conversion elements (hereinafter also referred to as "high-sensitive pixels") and relatively low-sensitive photoelectric conversion elements (hereinafter also referred to as "low-sensitive pixels") has been proposed in order to obtain a wide dynamic range image (see Japanese Patent Laid-Open No. 2000-69491, Japanese Patent Laid-Open No. 2000-316163 and Japanese Patent Laid-Open No. 2001-238126).

In an image pickup device described in Japanese Patent Laid-Open No. 2000-69491, color pixel groups each composed of four or two pixel units having color filters equal in color component but different in light transmittance are arranged in the form of a lattice. When the image pickup device is used, signals output from the four or two pixels in each color pixel group can be synthesized to thereby obtain a photograph image signal of a wide dynamic range.

In an image pickup device described in Japanese Patent Laid-Open No. 2000-316163, unit blocks different in sensitivity are arranged in such a cyclic color coding arrangement manner that high-sensitive blocks and low-sensitive blocks are arranged in the form of a checkered pattern. When the image pickup device is used, signals output from pixels in the high-sensitive blocks and signals output from pixels in the low-sensitive blocks can be selectively added up to thereby obtain a photograph image signal of a wide dynamic range.

In an image pickup device described in Japanese Patent Laid-Open No. 2001-238126, high-sensitive regions and low-sensitive regions are arranged alternately at intervals of two vertical lines. An image based on an image signal read from the image pickup device is formed in such a manner that high-sensitive images output from the high-sensitive regions and low-sensitive images output from the low-sensitive regions are generated separately according to the lines. After an interpolating process is applied to each region group to enlarge the image, the two region groups can be synthesized in a predetermined mixture ratio to thereby obtain a photograph image signal of a wide dynamic range.

SUMMARY OF THE INVENTION

Each of the image pickup devices described in Japanese Patent Laid-Open No. 2000-69491, Japanese Patent Laid-Open No. 2000-316163 and Japanese Patent Laid-Open No. 2001-238126, however, has a problem that resolution in at least one of a vertical direction and a horizontal direction is lowered against an attempt to obtain a photograph image having a widened dynamic range.

Under such circumstances, an object of the invention is provide a solid-state image pickup device, an image pickup unit and an image processing method in which the dynamic range can be widened without substantial lowering of resolution both in a vertical direction and in a horizontal direction.

The invention provides a solid-state image pickup device including a semiconductor substrate, and a plurality of photoelectric conversion elements arranged on a surface of the semiconductor substrate both in a line direction and in a column direction perpendicular to the line direction to form a tetragonal lattice, wherein: the photoelectric conversion elements include a plurality of high-sensitive photoelectric conversion elements for performing photoelectric conversion in relatively high sensitivity, and a plurality of low-sensitive photoelectric conversion elements for performing photoelectric conversion in relatively low sensitivity; and the plurality of high-sensitive photoelectric conversion elements and the plurality of low-sensitive photoelectric conversion elements are arranged so as to be shaped like a checkered pattern. When the solid-state image pickup device is used, a synthetic image generated from an image pickup signal output from a high-sensitive photoelectric conversion element and an image pickup signal output from a low-sensitive photoelectric conversion element adjacent to the high-sensitive photoelectric conversion element can be regarded as an independent pixel located in the center of gravity of the two pixels. As a result, image signals arranged in the form of a checkered pattern can be obtained virtually. Accordingly, the dynamic range can be widened without substantial lowering of resolution both in the vertical direction and in the horizontal direction.

Preferably, in the solid-state image pickup device according to the invention, the photoelectric conversion elements are arranged so that a high-sensitive photoelectric conversion element and a low-sensitive photoelectric conversion element adjacent to the high-sensitive photoelectric conversion element in the same position relation have the same relative spectral sensitivity characteristic with its sensitivity ratio kept constant. When the spectral sensitivity characteristics of the photoelectric conversion elements are set as described above, a color image can be acquired easily.

Preferably, in the solid-state image pickup device according to the invention, each of the photoelectric conversion elements has any one of spectral sensitivities for three or four colors; and the high-sensitive photoelectric conversion elements and the low-sensitive photoelectric conversion elements arranged so as to be shaped like a tetragonal lattice respectively are arranged in the form of color coding arrangement in which 2×2 tetragonal lattices are arranged cyclically when viewed obliquely at an angle of 45 degrees.

Preferably, in the solid-state image pickup device according to the invention, the color coding arrangement of cyclic 2×2 tetragonal lattices is Bayer arrangement.

The invention also provides an image pickup unit including a solid-state image pickup device defined above, wherein: the image pickup unit further includes a signal processing portion for executing signal processing based on an image pickup signal output from the solid-state image pickup device; and the signal processing executed by the signal processing portion includes a synthesizing process for generating synthetic signals from high-sensitive image pickup signals output from the high-sensitive photoelectric conversion elements and low-sensitive image pickup signals output from the low-sensitive photoelectric conversion elements adjacent to the high-sensitive photoelectric conversion elements in the same positional relation respectively, an synchronizing process for synchronizing the synthetic signals generated in checkered pattern-like positions by the synthesizing process, and an interpolating process for interpolating checkered pattern-like positions having no synthetic signal.

The invention further provides an image pickup unit including a solid-state image pickup device defined above, wherein: the image pickup unit further includes a signal processing portion for executing signal processing based on an image pickup signal output from the solid-state image pickup device; and the signal processing executed by the signal processing portion includes a process for generating high-sensitive image signals inclusive of signals in all lattice positions of the tetragonal lattice arrangement on the basis of high-sensitive image pickup signals output from the high-sensitive photoelectric conversion elements, a process for generating low-sensitive image signals inclusive of signals in all lattice positions of the tetragonal lattice arrangement on the basis of low-sensitive image pickup signals output from the low-sensitive photoelectric conversion elements, and a process for synthesizing the high-sensitive image signals and the low-sensitive image signals in lattice positions of the tetragonal lattice arrangement respectively.

The invention further provides an image processing method for executing signal processing based on an image pickup signal output from a solid-state image pickup device defined above, including: the synthesis step of generating synthetic image pickup signals from synthesizing high-sensitive image pickup signals output from the high-sensitive photoelectric conversion elements and low-sensitive image pickup signals output from the low-sensitive photoelectric conversion elements adjacent to the high-sensitive photoelectric conversion elements in the same positional relation respectively; and the interpolation step of generating image signals in intermediate positions of the checkered pattern-like arrangement on the basis of the synthetic image pickup signals generated in the checkered pattern-like positions obtained by the synthesis step.

The invention further provides an image processing method for executing signal processing based on an image pickup signal output from a solid-state image pickup device defined above, including: the first image generation step of generating high-sensitive image signals inclusive of signals in all lattice positions of the tetragonal lattice arrangement based on high-sensitive image pickup signals output from the high-sensitive photoelectric conversion elements; the second image generation step of generating low-sensitive image signals inclusive of signals in all lattice positions of the tetragonal lattice arrangement based on low-sensitive image pickup signals output from the low-sensitive photoelectric conversion elements; and the synthesis step of synthesizing the high-sensitive image signals and the low-sensitive image signals in lattice positions of the tetragonal lattice arrangement respectively.

BRIEF DESCRIPTION OF THE DRAWINGS

[FIG. 5]
It is a view showing the positional relation between high-sensitive image data.

[FIG. 6]
It is a view showing the positional relation between low-sensitive image data.

DESCRIPTION OF THE REFERENCE NUMERALS

Figure 1:
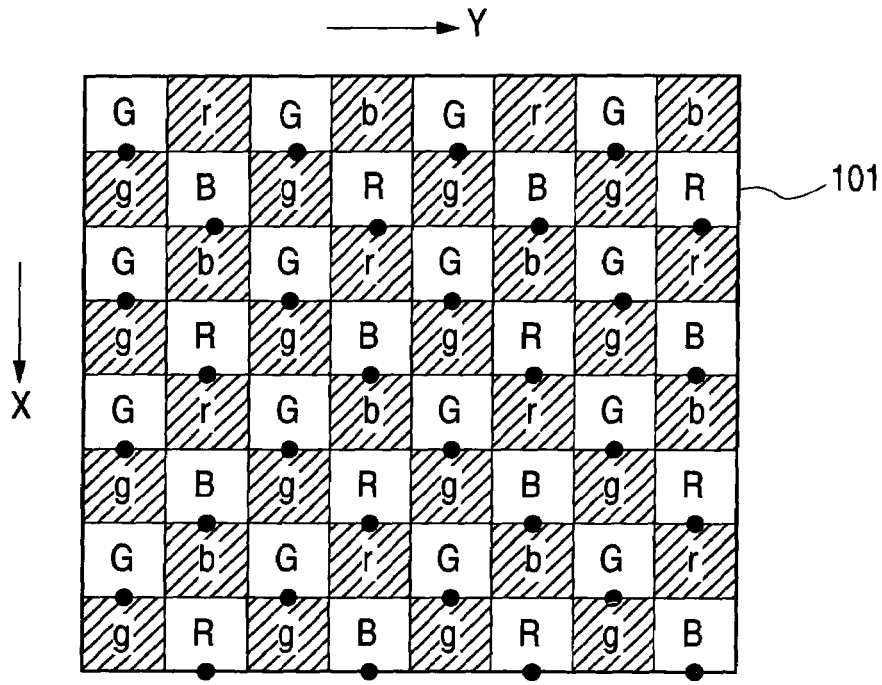
[FIG. 1]
It is a view showing an example arrangement of photoelectric conversion elements in a solid-state image pickup device according to an embodiment of the invention.

1 . . . image pickup portion
2 . . . analog signal processing portion
3 . . . A/D conversion portion
4 . . . drive portion
5 . . . stroboscope
6 . . . digital signal processing portion
7 . . . data compressing/expanding portion
8 . . . display portion
9 . . . system control portion
10 . . . internal memory
11 . . . media interface
12 . . . recording media
13 . . . operation portion
20 . . . system bus
100 . . . photograph lens
101 . . . solid-state image pickup device

DETAILED DESCRIPTION OF THE INVENTION

Figure 7:
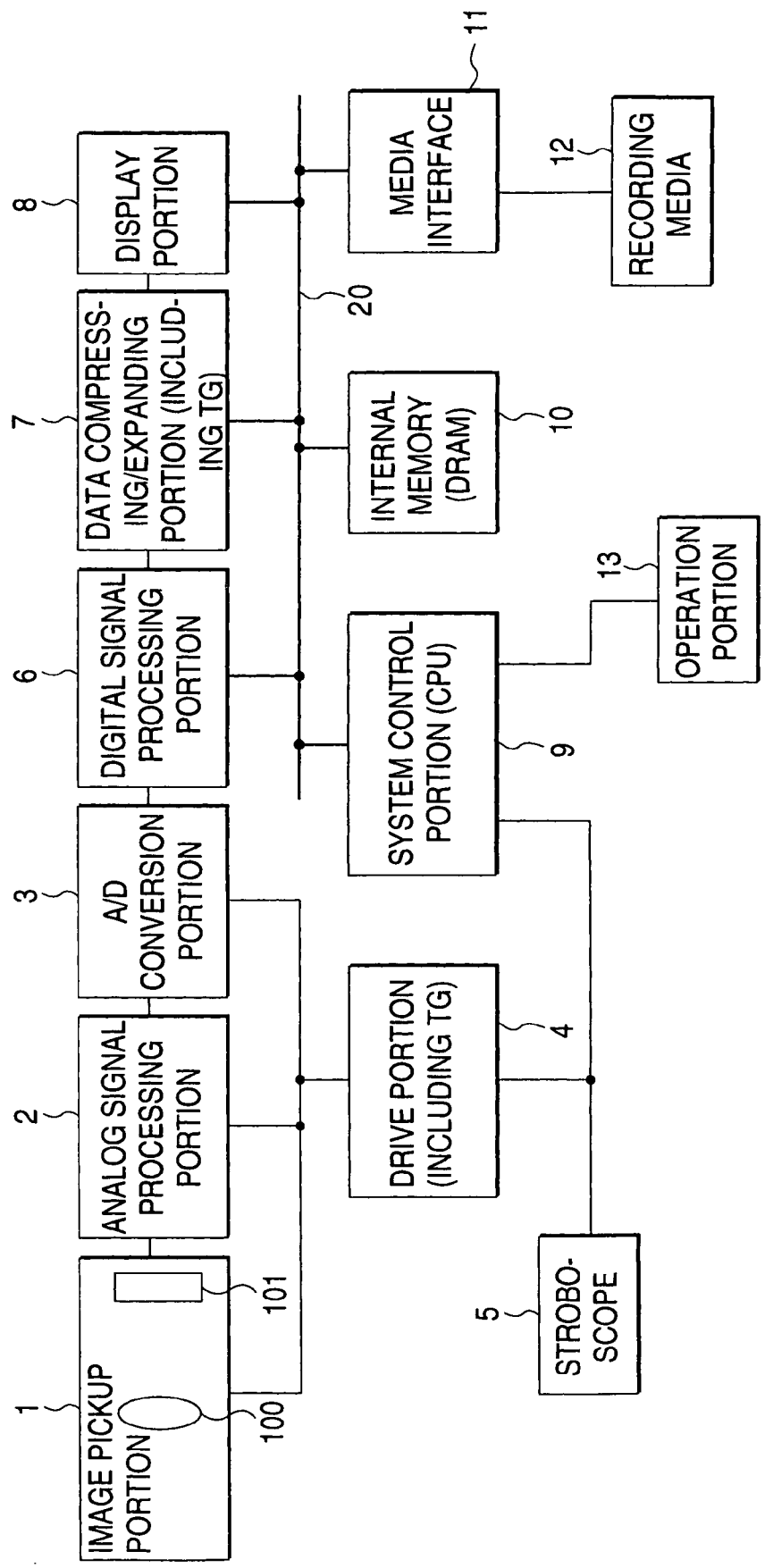
[FIG. 7]
It is a diagram showing an example schematic configuration of a digital camera according to an embodiment of the invention.

An embodiment of the invention will be described with reference to the drawings. FIG. 7 is a diagram showing an example schematic configuration of a digital camera according to an embodiment of the invention. The digital camera shown in FIG. 7 includes an image pickup portion 1, an analog signal processing portion 2, an A/D conversion portion 3, a drive portion 4, a stroboscope 5, a digital signal processing portion 6, a data compressing/expanding portion 7, a display portion 8, a system control portion 9, an internal memory 10, a media interface 11, recording media 12, and an operation portion 13. The digital signal processing portion 6, the data compressing/expanding portion 7, the display portion 8, the system control portion 9, the internal memory 10 and the media interface 11 are connected to one another by a system bus 20.

The image pickup portion 1 includes an optical system such as an image pickup lens 100 and a solid-state image pickup device 101. The image pickup portion 1 picks up an image of a subject and outputs an analog image pickup signal. The image pickup signal obtained in the image pickup portion 1 is sent to the analog signal processing portion 2. After a predetermined analog signal processing, the analog signal is converted into a digital signal by the A/D conversion portion 3. The digital signal is sent as so-called RAW image data to the digital signal processing portion 6. The RAW image data is digital image data which is generated in such a manner that the image pickup signal output from the image pickup portion 1 is digitized while the format of the image pickup signal is retained.

When the image is to be picked up, the image pickup portion 1 is controlled through the drive portion 4. The solid-state image pickup device 101 such as a CCD image sensor has a semiconductor substrate, and a plurality of photoelectric conversion elements (such as photodiodes) arranged on a surface of the semiconductor substrate both in a line direction and in a column direction generally perpendicular to the line direction to form a tetragonal lattice. The solid-state image pickup device 101 outputs an analog voltage signal based on signal electric charge generated and accumulated in accordance with incident light. The solid-state image pickup device 101 is driven by a drive signal which is generated from a timing generator TG (FIG. 7) included in the drive portion 4 at predetermined timing while turning on a release switch (not shown) by the operation of a release button (not shown) which is a part of the operation portion 13 is used as a turning point. The drive portion 4 outputs a predetermined drive signal under control of the system control portion 9. The drive portion 4 also outputs drive signals for the analog signal processing portion 2 and the A/D conversion portion 3. The details of the solid-state image pickup device 101 will be described later.

The stroboscope 5 operates when the luminance of the subject is not higher than a predetermined value. The stroboscope 5 is controlled by the system control portion 9.

The digital signal processing portion 6 applies digital signal processing to the digital image data output from the A/D conversion portion 3 according to an operation mode set by the operation portion 13. The processing executed by the digital signal processing portion 6 includes a black level correction process (OB process), a linear matrix correction process (for correcting primary color signals output from the image pickup portion by 3×3 matrix calculation for RGB input signals to thereby remove mixed color components caused by the photoelectric conversion characteristic of the image pickup device), a white balance control process (gain control), a gamma correction process, an image synthesizing process, a synchronizing process, and a Y/C conversion process. The image synthesizing process in the digital signal processing portion 6 will be described later.

For example, the digital signal processing portion 6 is made of a digital signal processor (DSP). The data compressing/expanding portion 7 compresses Y/C data output from the digital signal processing portion 6 and expands compressed image data output from the recording media 12.

For example, the display portion 8 includes a liquid crystal display device (LCD). The display portion 8 displays an image based on image data picked up and subjected to digital signal processing. The display portion 8 also displays an image based on image data obtained by expanding compressed image data recorded in the recording media. The display portion 8 can further display a through-image at the time of picking up an image and information concerning any kind of state or operation of the digital camera.

For example, the internal memory 10 is made of dynamic random access memory (DRAM). The internal memory 10 is used as work memory for the digital signal processing portion 6 and the system control portion 9. The internal memory 10 is also used as buffer memory for temporarily storing picked-up image data recorded in the recording media 12 or as buffer memory for temporarily storing image data displayed on the display portion 8. The media interface 11 controls input/output of data between the digital camera and the recording media 12 such as a memory card.

The system control portion 9 controls the whole of the digital camera inclusive of an image pickup operation. Specifically, the system control portion 9 is mainly composed of a processor (CPU) which operates according to a predetermined program.

The operation portion 13 performs various kinds of operations in use of the digital camera. An operation mode (such as a photographing mode, a play-back mode or the like) of the digital camera, a photographing method used in the photographing mode, a photographing condition, etc. can be set by the operation portion 13. Operation members corresponding to the respective functions of the operation portion 13 may be provided or operation members used in common with the display portion 8 may be provided in the operation portion 13 so as to be interlocked with display on the display portion 8. The operation portion 13 further includes a release button for starting the photographing operation.

The solid-state image pickup device 101 will be described below more in detail. The solid-state image pickup device 101 includes photoelectric conversion elements arranged in the form of a tetragonal lattice. The photoelectric conversion elements include a plurality of high-sensitive photoelectric conversion elements for performing photoelectric conversion in relatively high sensitivity, and a plurality of low-sensitive photoelectric conversion elements for performing photoelectric conversion in relatively low sensitivity. The plurality of high-sensitive photoelectric conversion elements and the plurality of low-sensitive photoelectric conversion elements are arranged in the form of a checkered pattern. High-sensitive image pickup signals and low-sensitive image pickup signals output from the high-sensitive photoelectric conversion elements and the low-sensitive photoelectric conversion elements are converted into digital image data respectively by the analog signal processing portion 2 and the A/D conversion portion 3. The digital image data are sent to the digital signal processing portion 6.

Incidentally, in the case of a CCD type solid-state image pickup device, signal electric charge accumulated on each photoelectric conversion element is taken out to the outside through a charge transfer path not shown, so that a voltage signal corresponding to the amount of signal electric charge taken out is output as an analog image pickup signal. In the case of an MOS type solid-state image pickup device, a voltage signal corresponding to the amount of signal electric charge accumulated on each photoelectric conversion element is taken out through wiring arranged in the form of a matrix. Because the CCD type solid-state image pickup device and the MOS type solid-state image pickup device are known commonly, the description of the specific configuration, the image pickup signal output method, etc. will be omitted.

Photoelectric conversion signals different in sensitivity can be obtained when the aperture area of each photoelectric conversion element is changed (e.g., see Japanese Patent Laid-Open No. 2001-8104), when the light transmittance of a filter provided above each photoelectric conversion element is changed (e.g., see Japanese Patent Laid-Open No. 2000-69491 and Japanese Patent Laid-Open No. 2000-316163) or when the shape of a microlens provided above each photoelectric conversion element is changed (e.g., see Japanese Patent Laid-Open No. 2001-8104).

FIG. 1 shows an example ef arrangement of photoelectric conversion elements in the solid-state image pickup device 101 used in an embodiment of the invention. Although FIG. 1 shows 8×8 photoelectric conversion elements for the sake of simplification, the solid-state image pickup device 101 actually has a larger number of photoelectric conversion elements. In the solid-state image pickup device 101 shown in FIG. 1, three types of color filters are arranged above the photoelectric conversion elements. The three types of color filters have spectral sensitivities for red (hereinafter also referred to as "R" or "r" simply), green (hereinafter also referred to as "G" or "g" simply) and blue (hereinafter also referred to as "B" or "b" simply) respectively.

Each of the high-sensitive photoelectric conversion elements (designated by the reference symbols R, G and B in FIG. 1) arranged in the form of a checkered pattern has spectral sensitivity for any one of red, green and blue. The color coding arrangement of the high-sensitive photoelectric conversion elements is formed so that 2×2 tetragonal lattices are arranged cyclically when viewed obliquely at an angle of 45 degrees. Similarly, each of the low-sensitive photoelectric conversion elements (which are hatched positions designated by the reference symbols r, g and b in FIG. 1) arranged in the form of a checkered pattern has spectral sensitivity for any one of red, green and blue. The color coding arrangement of the low-sensitive photoelectric conversion elements is formed so that 2×2 tetragonal lattices are arranged cyclically when viewed obliquely at an angle of 45 degrees. For example, the cyclic arrangement of 2×2 tetragonal lattices may be Bayer arrangement as shown in FIG. 1.

As shown in FIG. 1, the color coding arrangement of the high-sensitive photoelectric conversion elements and the color coding arrangement of the low-sensitive photoelectric conversion elements have relation with each other so that photoelectric conversion elements are shifted vertically by one pixel. That is, a high-sensitive photoelectric conversion element and a low-sensitive photoelectric conversion element downward adjacent to the high-sensitive photoelectric conversion element in a vertical direction (X direction) have the same relative spectral sensitivity characteristic with the sensitivity ratio kept constant. Alternatively, the color coding arrangement of the high-sensitive photoelectric conversion elements and the color coding arrangement of the low-sensitive photoelectric conversion elements may have relation with each other so that photoelectric conversion elements are shifted by one pixel in a horizontal direction (Y direction).

Although primary color filters are used in the solid-state image pickup device shown in FIG. 1, additive complementary color filters may be used. In this case, four types of color filters for green, yellow, cyan and magenta may be used as the color filters. Incidentally, in the solid-state image pickup device shown in FIG. 1, photoelectric conversion elements different in spectral sensitivity characteristic are arranged in order to obtain a color photograph image. If there is no need for color photographing, relative spectral sensitivity characteristics of all photoelectric conversion elements can be set to be equal to one another.

Figure 2:
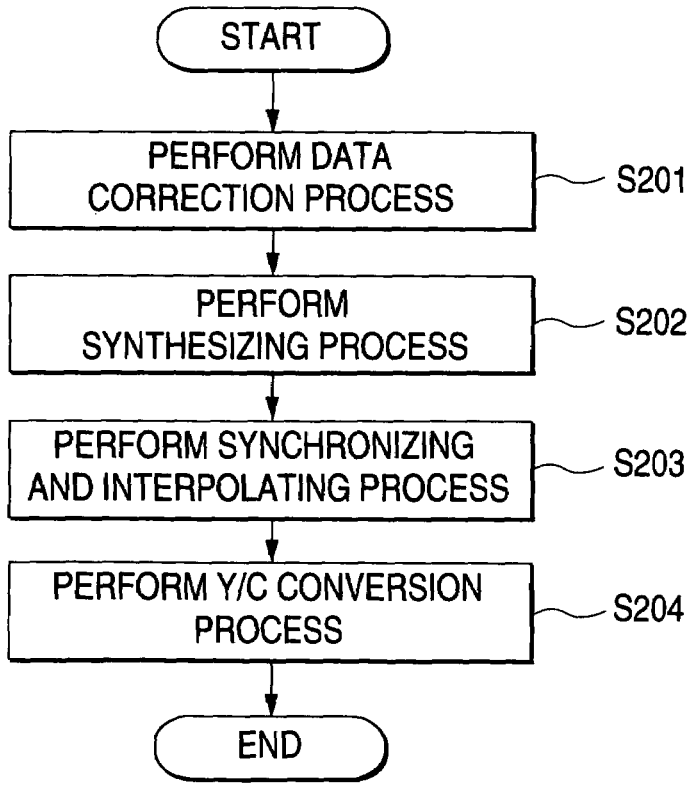
[FIG. 2]
It is a flow chart showing an example schematic operation flow of digital signal processing in an embodiment of the invention.

The functions of the digital signal processing portion 6 will be described below with the image synthesizing process as a main topic. FIG. 2 is a flow chart showing an example of the schematic operation flow of the digital signal processing portion 6. In step S201, RAW image data output from the A/D conversion portion 3 are corrected. This correction process includes an OB process, a linear matrix correction process, a white balance control process, a gamma correction process, etc. Signals concerning all pixels of the solid-state image pickup device 101 are output as RAW image data from the A/D conversion portion 3 successively. (In the case of a CCD type solid-state image pickup device, a progressive scanning method is used). That is, in the case of arrangement shown in FIG. 1, after signals concerning pixels GrGbGrGb on the first line are output, signals concerning pixels gBgRgBgR on the second line are output. Signals concerning pixels on the third to eighth lines are then output successively.

In step S202, a synthesizing process is carried out by use of the corrected image data. The synthesizing process is made in such a manner that image data of a high-sensitive pixel is synthesized with image data of a low-sensitive pixel adjacent to the high-sensitive pixel and having the same relative spectral sensitivity characteristic and the same positional relation. As shown in FIG. 1, a high-sensitive pixel in the solid-state image pickup device 101 and a low-sensitive pixel downward adjacent to the high-sensitive pixel in the vertical direction (X direction) have the same relative spectral sensitivity characteristic. Accordingly, image data of pixels vertically adjacent to each other are synthesized. The following expression (1) is an example of the synthesizing method.

$$Sc = \alpha S_H + (1-\alpha) S_L \tag{1}$$

In the expression (1), Sc is a synthetic signal, $S_H$ is a high-sensitive image signal, $S_L$ is a low-sensitive image signal, and α is a coefficient for deciding the synthesizing ratio. In the case of a color image, the synthetic signal Sc can be replaced by a red synthetic signal Rc, a green synthetic signal Gc or a blue synthetic signal Bc, and the high-sensitive and low-sensitive image signals $S_H$ and $S_L$ can be replaced by red high-sensitive and low-sensitive image signals R and r, green high-sensitive and low-sensitive image signals G and g or blue high-sensitive and low-sensitive image signals B and b. The coefficient α is a value satisfying the relation 0<α<1. Although the coefficient a depends on a photographing scene, the coefficient α is preferably selected to be in a range of from 0.5 to 0.8.

Figures 3, 4:
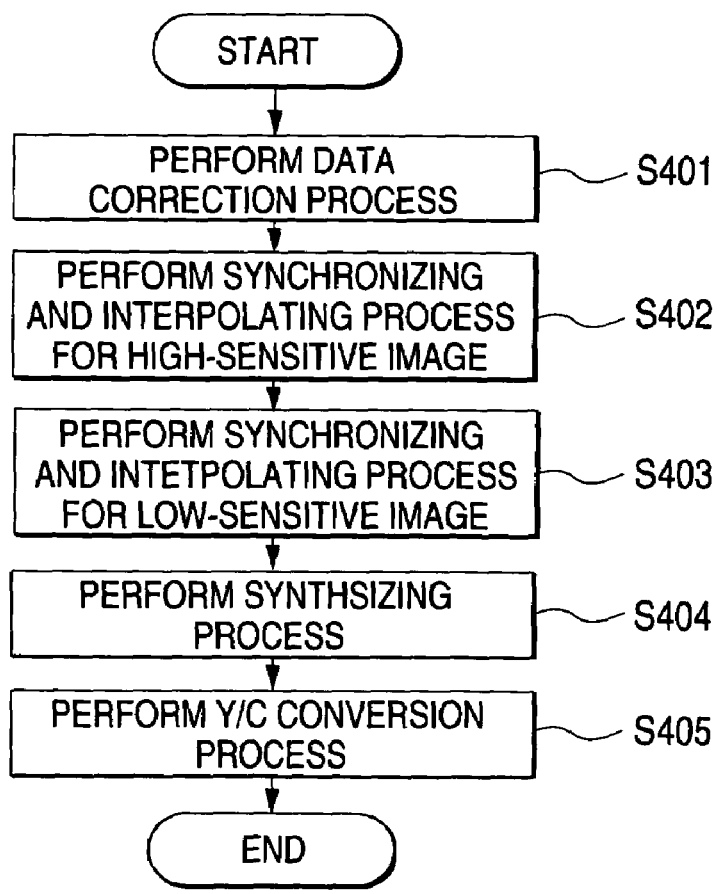
[FIG. 3]
It is a view showing the positional relation between synthetic image signals.
[FIG. 4]
It is a flow chart showing another example schematic operation flow of digital signal processing in an embodiment of the invention.

In the case of pixel arrangement shown in FIG. 1, because a signal of a high-sensitive pixel and a signal of a low-sensitive pixel vertically adjacent to the high-sensitive pixel are synthesized, each synthetic signal Rc, Gc or Bc virtually expresses an image pickup signal in the position of a black dot "●" in FIG. 1. Although the black dot "●" is shown in a middle position between the high-sensitive pixel and the low-sensitive pixel for convenience' sake, the black dot "●" is actually in the position of the center of gravity of the two pixels. Accordingly, the synthetic signals Rc, Gc and Bc express image signals in positions shaped like a checkered pattern as shown in FIG. 3. Incidentally, white dots "○" in FIG. 3 express lattice positions where no image signal is obtained.

The synthesizing operation can be carried out in real time while data are received from the A/D conversion portion 3 because image data on adjacent two lines are used. In the case of an interlace type solid-state image pickup device in which image data of all pixels are read in several reading cycles, the synthesizing process is carried out after image signals of all pixels are temporarily stored in the internal memory 10 or the like.

After image signals in positions shaped like a checkered pattern as shown in FIG. 3 are obtained, a synchronizing and interpolating process is carried out in step S203. That is, for pixels in each of which only one color signal of red, green or blue is obtained, the other color signals are obtained. In addition, image signals in positions of white dots "○" in which no image signal is obtained are obtained. In this manner, RGB signals in all lattice positions are obtained. The description of specific operations in the synchronizing and interpolating process will be omitted because various methods have been already proposed for the synchronizing and interpolating process.

After RGB signals in all lattice positions are obtained, a Y/C conversion process is carried out in step S204. The Y/C conversion process is a process for converting RGB data into Y/C data. The obtained Y/C data are sent to the data compressing/expanding portion 7.

Because the image data obtained by the aforementioned process are based on synthetic image data located in checkered pattern-like positions as shown in FIG. 3, there is no substantial lowering of resolution both in the vertical direction and in the horizontal direction. Although the above description of processing in FIG. 2 is based on the assumption that a solid-state image pickup device having primary color filters is used, processing shown in FIG. 2 may be applied to a monochrome solid-state image pickup device. In this case, there are two points of difference between the monochrome solid-state image pickup device and the solid-state image pickup device having primary color filters. The first point is in that combinations for synthesizing high-sensitive photoelectric conversion elements and low-sensitive photoelectric conversion elements adjacent to the high-sensitive photoelectric conversion elements respectively are decided uniquely by the solid-state image pickup device in the case of use of primary color filters whereas combinations on four lines or columns in each line or column direction can be made in the case of monochrome regardless of colors. Therefore, one of combinations on four lines or columns can be selected. The second point is in that the expression (1) is calculated regardless of colors, that is, Sc, $S_H$ and $S_L$ express a synthetic signal of luminance signals, a high-sensitive pixel signal and a low-sensitive pixel signal respectively.

FIG. 4 shows another example of the schematic operation flow of the digital signal processing portion 6. In the processing shown in FIG. 2, the synchronizing and interpolating process is carried out after the synthesizing process. In the example shown in FIG. 4, the synchronizing and interpolating process is carried out before the synthesizing process.

In step S401, like step S201 in FIG. 2, RAW image data output from the A/D conversion portion 3 are corrected. Then, in step S402, a synchronizing and interpolating process is carried out by use of the corrected image data of high-sensitive pixels. In step S403, a synchronizing and interpolating process is carried out by use of the corrected image data of low-sensitive pixels.

Figures 5, 6:
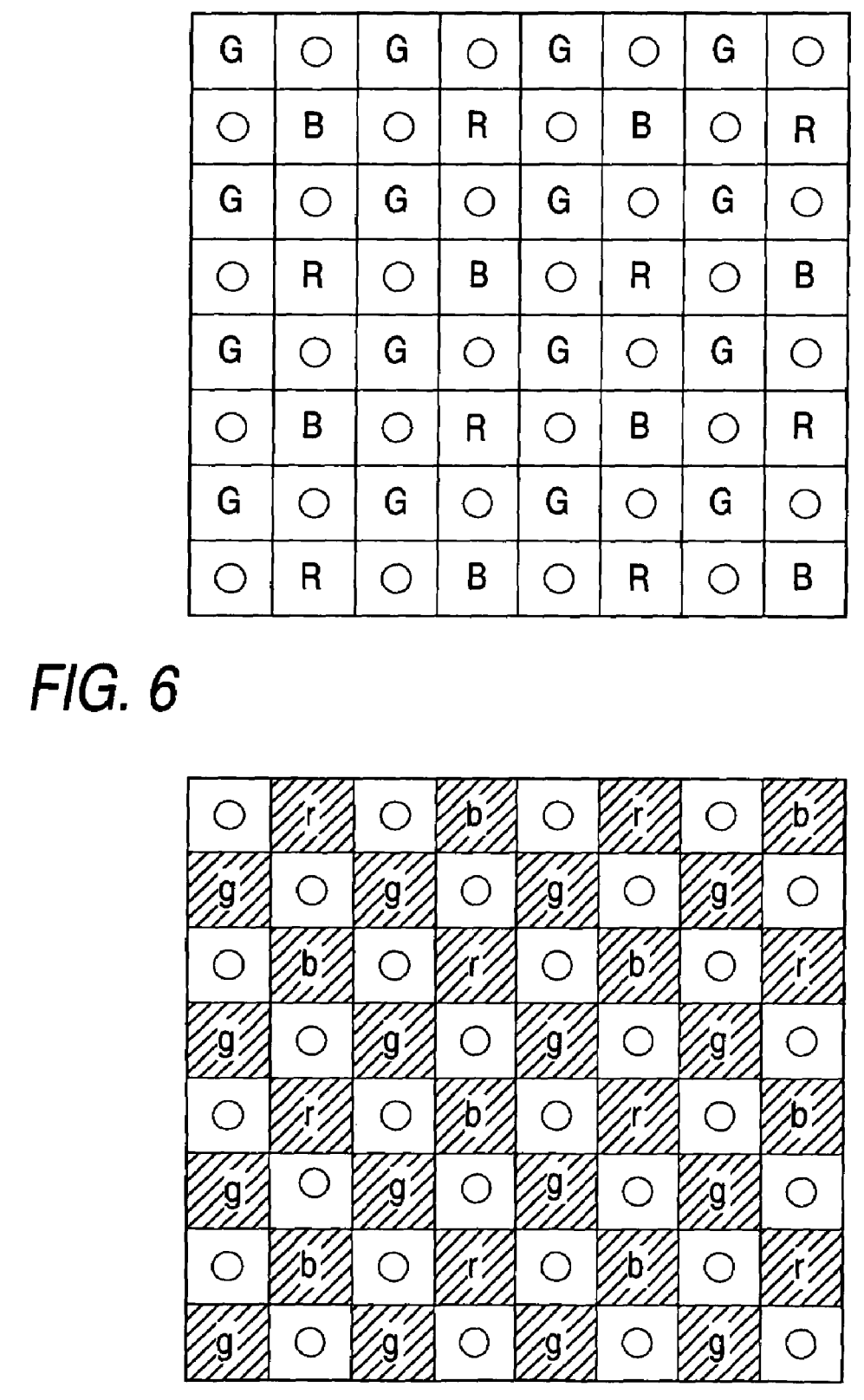

The high-sensitive image data are image data arranged as shown in FIG. 5 (white dots "○" designate positions where no image signal is obtained). Accordingly, in step S402, the synchronizing and interpolating process is carried out in the same manner as in the step S203 in FIG. 2. That is, for pixels in each of which only one color signal of red, green or blue is obtained, the other color signals are obtained. In addition, image signals in positions of white dots "○" where no image signal is obtained are obtained. In this manner, high-sensitive RGB signals in all lattice positions are obtained. On the other hand, the low-sensitive image data are image data arranged in the form of a checkered pattern as shown in FIG. 6 (white dots "○" designate positions where no image signal is obtained). Accordingly, in step S403, the synchronizing and interpolating process is carried out in the same manner as described above. That is, for pixels in each of which only one color signal of red, green or blue is obtained, the other color signals are obtained. In addition, image signals in positions of white dots "○" where no image signal is obtained are obtained. In this manner, low-sensitive RGB signals in all lattice positions are obtained.

In the processing in the step S402, a synchronizing and interpolating process is executed for pertinent pixels in order whenever high-sensitive image data necessary for the process are acquired. Low-sensitive image data unnecessary for the process are stored in the internal memory 10 or the like during the process. In step S403, a synchronizing and interpolating process is executed by use of the low-sensitive image data stored in the internal memory 10 or the like. Incidentally, in the case of an interlace type solid-state image pickup device, after image signals of all pixels are temporarily stored in the internal memory 10 or the like, a synchronizing and interpolating process is executed for high-sensitive image data and then a synchronizing and interpolating process is executed for low-sensitive image data. The sequence of the steps S402 and S403 may be reversed.

When the steps S402 and S403 are completed, high-sensitive RGB signals and low-sensitive RGB signals in all lattice positions are obtained. Accordingly, in step S404, the high-sensitive RGB signals and the low-sensitive RGB signals are synthesized. The synthesizing process is executed in accordance with every lattice position and every color signal. The following expression (2) is an example of the synchronizing method.

$$Rc(x,y)=\alpha R(x,y)+(1-\alpha)r(x,y)$$

$$Gc(x,y)=\alpha G(x,y)+(1-\alpha)g(x,y)$$

$$Bc(x,y)=\alpha B(x,y)+(1-\alpha)b(x,y) \qquad (2)$$

In the expression (2), Rc(x,y), Gc(x,y) and Bc(x,y) are a synthetic red signal, a synthetic green signal and a synthetic blue signal respectively in a pixel position (x,y), R, G and B are a high-sensitive red signal, a high-sensitive green signal and a high-sensitive blue signal respectively in the pixel position (x,y), r, g and b are a low-sensitive red signal, a low-sensitive green signal and a low-sensitive blue signal respectively in the pixel position (x,y), and α is a coefficient for deciding the synthesizing ratio. The coefficient α is selected to satisfy the relation 0<α<1. Although the coefficient a depends on the synthesizing ratio, the coefficient α is preferably selected to be in a range of from 0.5 to 0.8.

After synthetic RGB signals in all lattice positions are obtained, a Y/C conversion process is carried out in step S405 in the same manner as in the step S204 in FIG. 2. Because signals in the same pixel positions are synthesized by the aforementioned synthesizing process, there is expectation that lowering of resolution can be suppressed more sufficiently. The above description can be applied not only to the solid-state image pickup device having primary color filters but also to a monochrome solid-state image pickup device or a solid-state image pickup device having additive complementary color filters.

Although the step S404 in FIG. 4 shows the case where high-sensitive RGB signals and low-sensitive RGB signals are synthesized, the invention may be applied to the case where a high-sensitive luminance signal and a high-sensitive color difference signal (Y/C signals) calculated based on high-sensitive RGB signals and a low-sensitive luminance signal and a low-sensitive color difference signal (Y/C signals) calculated based on low-sensitive RGB signals are synthesized to obtain synthetic Y/C data.

From the above description, in accordance with the embodiments of the invention, there can be provided a solid-state image pickup device and an image pickup unit in which the dynamic range can be widened without substantial lowering of resolution both in the vertical direction and in the horizontal direction.

This application is based on Japanese Patent application JP 2003-130413, filed May 8, 2003, the entire content of which is hereby incorporated by reference, the same as if set forth at length.

What is claimed is:

1. A solid-state image pickup device, comprising:
   a semiconductor substrate; and
   a plurality of photoelectric conversion elements arranged on a surface of said semiconductor substrate both in a line direction and in a column direction substantially perpendicular to the line direction to form a tetragonal lattice,
   wherein said photoelectric conversion elements include a plurality of high-sensitive photoelectric conversion elements and a plurality of low-sensitive photoelectric conversion elements, the plurality of high-sensitive photoelectric conversion elements configured to perform photoelectric conversion with higher sensitivity relative to the plurality of low-sensitive conversion elements,
   wherein said plurality of high-sensitive photoelectric conversion elements and said plurality of low-sensitive photoelectric conversion elements are arranged in a checkered pattern such that the high-sensitive photoelectric conversion elements and the low-sensitive photoelectric conversion elements alternate one by one in both the line and column directions,
   wherein each photoelectric conversion element is sensitive to a single color, and
   wherein for each high-sensitive photoelectric conversion element sensitive to a particular color, the high-sensitive photoelectric conversion element is relatively more sensitive to luminance relative to each of the low-sensitive photoelectric conversion elements that are sensitive to the same particular color.

2. The solid-state image pickup device according to claim 1, wherein said photoelectric conversion elements are arranged so that a high-sensitive photoelectric conversion element and a low-sensitive photoelectric conversion element adjacent to said high-sensitive photoelectric conversion element in one of the line direction or the column direction have a same relative spectral sensitivity characteristic with a ratio kept substantially constant.

3. The solid-state image pickup device according to claim 2, wherein:
   each of said photoelectric conversion elements has any one of spectral sensitivities for three or four colors; and
   said high-sensitive photoelectric conversion elements and said low-sensitive photoelectric conversion elements are arranged in a form of color coding arrangement in which 2×2 tetragonal lattices are arranged cyclically when viewed obliquely at an angle of 45 degrees.

4. The solid-state image pickup device according to claim 3,
   wherein said plurality of photoelectric conversion elements are arranged in a first line repeating pattern GrGb and a second line repeating pattern gBgR, and wherein said first and second line patterns alternate line by line, and
   where R, G, B are high-sensitive photoelectric conversion elements of red, green and blue colors, respectively, and r, g, b are low-sensitive photoelectric conversion elements of red, green and blue colors.

5. The image pickup device of claim 1, wherein the solid-state image pickup device is a RGB device and the particular color is one of red, green, and blue.

6. The image pickup device of claim 1, wherein the solid-state image pickup device is a CMY device and the particular color is one of cyan, magenta, and yellow.

7. An image pickup unit, comprising:
   a solid-state image pickup device comprising:
   a semiconductor substrate; and
   a plurality of photoelectric conversion elements arranged on a surface of said semiconductor substrate both in a line direction and in a column direction substantially perpendicular to the line direction to form a tetragonal lattice,
   wherein said photoelectric conversion elements include a plurality of high-sensitive photoelectric conversion elements and a plurality of low-sensitive photoelectric conversion elements, the plurality of high-sensitive photoelectric conversion elements configured to perform photoelectric conversion with higher sensitivity relative to the plurality of low-sensitive conversion elements,
   wherein said plurality of high-sensitive photoelectric conversion elements and said plurality of low-sensitive photoelectric conversion elements are arranged in a checkered pattern,
   wherein each photoelectric conversion element is sensitive to a single color,
   wherein for each high-sensitive photoelectric conversion element sensitive to a particular color, the high-sensitive photoelectric conversion element is relatively more sensitive to luminance relative to each of the low-sensitive photoelectric conversion elements that are sensitive to the same particular color; and
   a signal processing portion configured to execute signal processing based on an image pickup signal output from said solid-state image pickup device,
   wherein said signal processing executed by said signal processing portion includes
   a synthesizing process for generating synthetic signals from high-sensitive image pickup signals output from said high-sensitive photoelectric conversion elements and low-sensitive image pickup signals output from said low-sensitive photoelectric conversion elements adjacent to said high-sensitive photoelectric conversion elements in the same positional relation respectively,
   a synchronizing process for synchronizing said synthetic signals generated in checkered pattern-like positions by said synthesizing process, and
   an interpolating process for interpolating checkered pattern-like positions having no synthetic signal.

8. The image pickup unit according to claim 7, wherein said photoelectric conversion elements are arranged so that a high-sensitive photoelectric conversion element and a low-sensitive photoelectric conversion element adjacent to said high-sensitive photoelectric conversion element in one of the line direction or the colunm direction have a same relative spectral sensitivity characteristic with a ratio kept substantially constant.

9. The image pickup unit according to claim 8, wherein:
   each of said photoelectric conversion elements has any one of spectral sensitivities for three or four colors; and
   said high-sensitive photoelectric conversion elements and said low-sensitive photoelectric conversion elements are arranged in a form of color coding arrangement in which 2×2 tetragonal lattices are arranged cyclically when viewed obliquely at an angle of 45 degrees.

10. The image pickup unit according to claim 9,
wherein said plurality of photoelectric conversion elements are arranged in a first line repeating pattern GrGb and a second line repeating pattern gBgR, and wherein said first and second line patterns alternate line by line, and where R, G, B are high-sensitive photoelectric conversion elements of red, green and blue colors, respectively, and r, g, b are low-sensitive photoelectric conversion elements of red, green and blue colors.

11. The image pickup unit according to claim 7, wherein said photoelectric conversion elements are arranged so that the high-sensitive photoelectric conversion elements and the low-sensitive photoelectric conversion elements alternate one by one in both the line and column directions.

12. The image pickup unit of claim 7, wherein the solid-state image pickup device is a RGB device and the particular color is one of red, green, and blue.

13. The image pickup unit of claim 7, wherein the solid-state image pickup device is a CMY device and the particular color is one of cyan, magenta, and yellow.

14. An image pickup unit, comprising:
a solid-state image pickup device comprising a semiconductor substrate;
a plurality of photoelectric conversion elements arranged on a surface of said semiconductor substrate both in a line direction and in a column direction substantially perpendicular to the line direction to form a tetragonal lattice, wherein said photoelectric conversion elements include
a plurality of high-sensitive photoelectric conversion elements and a plurality of low-sensitive photoelectric conversion elements, the plurality of high-sensitive photoelectric conversion elements configured to perform photoelectric conversion with higher sensitivity relative to the plurality of low-sensitive conversion elements,
said plurality of high-sensitive photoelectric conversion elements and said plurality of low-sensitive photoelectric conversion elements are arranged in a checkered pattern,
each photoelectric conversion element is sensitive to a single color, and
wherein for each high-sensitive photoelectric conversion element sensitive to a particular color, the high-sensitive photoelectric conversion element is relatively more sensitive to luminance relative to each of the low-sensitive photoelectric conversion elements that are sensitive to the same particular color; and
a signal processing portion configured to execute signal processing based on an image pickup signal output from said solid-state image pickup device, wherein said signal processing executed by said signal processing portion includes
a process for generating high-sensitive image signals inclusive of signals in all lattice positions of said tetragonal lattice arrangement based on high-sensitive image pickup signals output from said high-sensitive photoelectric conversion elements,
a process for generating low-sensitive image signals inclusive of signals in all lattice positions of said tetragonal lattice arrangement based on low-sensitive image pickup signals output from said low-sensitive photoelectric conversion elements, and a process for synthesizing said high-sensitive image signals and said low-sensitive image signals in lattice positions of said tetragonal lattice arrangement respectively.

15. The image pickup unit according to claim 14, wherein said photoelectric conversion elements are arranged so that a high-sensitive photoelectric conversion element and a low-sensitive photoelectric conversion element adjacent to said high-sensitive photoelectric conversion element in one of the line direction or the column direction have a same relative spectral sensitivity characteristic with a ratio kept substantially constant.

16. The image pickup unit according to claim 15, wherein:
each of said photoelectric conversion elements has any one of spectral sensitivities for three or four colors; and
said high-sensitive photoelectric conversion elements and said low-sensitive photoelectric conversion elements arranged in a form of color coding arrangement in which 2×2 tetragonal lattices are arranged cyclically when viewed obliquely at an angle of 45 degrees.

17. The image pickup unit according to claim 16,
wherein said plurality of photoelectric conversion elements are arranged in a first line repeating pattern GrGb and a second line repeating pattern gBgR, and wherein said first and second line patterns alternate line by line, and where R, G, B are high-sensitive photoelectric conversion elements of red, green and blue colors, respectively, and r, g, b are low-sensitive photoelectric conversion elements of red, green and blue colors.

18. The image pickup unit according to claim 14, wherein said photoelectric conversion elements are arranged so that the high-sensitive photoelectric conversion elements and the low-sensitive photoelectric conversion elements alternate one by one in both the line and column directions.

19. The image pickup unit of claim 14, wherein the solid-state image pickup device is a RGB device and the particular color is one of red, green, and blue.

20. The image pickup unit of claim 14, wherein the solid-state image pickup device is a CMY device and the particular color is one of cyan, magenta, and yellow.

21. An image processing method for executing signal processing based on an image pickup signal output from a solid-state image pickup device comprising a semiconductor substrate, and a plurality of photoelectric conversion elements arranged on a surface of said semiconductor substrate both in a line direction and in a column direction substantially perpendicular to the line direction to form a tetragonal lattice, wherein said photoelectric conversion elements include a plurality of high-sensitive photoelectric conversion elements and a plurality of low-sensitive photoelectric conversion elements, the plurality of high-sensitive photoelectric conversion elements configured to perform photoelectric conversion with higher sensitivity relative to the plurality of low-sensitive conversion elements and said plurality of high-sensitive photoelectric conversion elements and said plurality of low-sensitive photoelectric conversion elements are arranged in a checkered pattern, each photoelectric conversion element is sensitive to a single color, wherein for each high-sensitive photoelectric conversion element sensitive to a particular color, the high-sensitive photoelectric conversion element is relatively more sensitive to luminance relative to each of the low-sensitive photoelectric conversion elements that are sensitive to the same particular color, the image processsing method comprising:
generating synthetic image pickup signals from synthesizing high-sensitive image pickup signals output from said high-sensitive photoelectric conversion elements and low-sensitive image pickup signals output from said low-sensitive photoelectric conversion elements adjacent to said high-sensitive photoelectric conversion elements in the same positional relation respectively; and generating image signals in intermediate positions of the checkered pattern-like arrangement on the basis of said synthetic image pickup signals generated in the checkered pattern-like positions obtained by the synthesis step.

22. The image processing method according to claim 21, wherein the image processing method is performed on the image pickup device wherein said photoelectric conversion elements are arranged so that a high-sensitive photoelectric conversion element and a low-sensitive photoelectric conversion element adjacent to said high-sensitive photoelectric conversion element in one of the line direction or the colunm direction have a same relative spectral sensitivity characteristic with a ratio kept substantially constant.

23. The image processing method according to claim 22, wherein the image processing method is performed on the image pickup device wherein:

each of said photoelectric conversion elements has any one of spectral sensitivities for three or four colors; and said high-sensitive photoelectric conversion elements and said low-sensitive photoelectric conversion elements are arranged in a form of color coding arrangement in which 2×2 tetragonal lattices are arranged cyclically when viewed obliquely at an angle of 45 degrees.

24. The image processing method according to claim 23, wherein the image processing method is performed on the image pickup device wherein said plurality of photoelectric conversion elements are arranged in a first line repeating pattern GrGb and a second line repeating pattern gBgR, and wherein said first and second line patterns alternate line by line, and where R, G, B are high-sensitive photoelectric conversion elements of red, green and blue colors, respectively, and r, g, b are low-sensitive photoelectric conversion elements of red, green and blue colors.

25. The image processing method according to claim 21, wherein the method is performed using the image pickup device which has the photoelectric conversion elements arranged so that the high-sensitive photoelectric conversion elements and the low-sensitive photoelectric conversion elements alternate one by one in both the line and column directions.

26. The image processing method of claim 21, wherein the solid-state image pickup device is a RGB device and the particular color is one of red, green, and blue.

27. The image processing method of claim 21, wherein the solid-state image pickup device is a CMY device and the particular color is one of cyan, magenta, and yellow.

28. An image processing method for executing signal processing based on an image pickup signal output from a solid-state image pickup device comprising a semiconductor substrate, and a plurality of photoelectric conversion elements arranged on a surface of said semiconductor substrate both in a line direction and in a column direction substantially perpendicular to the line direction to form a tetragonal lattice, wherein said photoelectric conversion elements include a plurality of high-sensitive photoelectric conversion elements and a plurality of low-sensitive photoelectric conversion elements, the plurality of high-sensitive photoelectric conversion elements configured to perform photoelectric conversion with higher sensitivity relative to the plurality of low-sensitive conversion elements, and said plurality of high-sensitive photoelectric conversion elements and said plurality of low-sensitive photoelectric conversion elements are arranged in a checkered pattern, each photoelectric conversion element is sensitive to a single color, wherein for each high-sensitive photoelectric conversion element sensitive to a particular color, the high-sensitive photoelectric conversion element is relatively more sensitive to luminance relative to each of the low-sensitive photoelectric conversion elements that are sensitive to the same particular color, the image proccessing method comprising:

generating high-sensitive image signals inclusive of signals in all lattice positions of said tetragonal lattice arrangement based on high-sensitive image pickup signals output from said high-sensitive photoelectric conversion elements;

generating low-sensitive image signals inclusive of signals in all lattice positions of said tetragonal lattice arrangement based on low-sensitive image pickup signals output from said low-sensitive photoelectric conversion elements; and a synthesis step of synthesizing said high-sensitive image signals and said low-sensitive image signals in lattice positions of said tetragonal lattice arrangement respectively.

29. The image processing method according to claim 28, wherein the image processing method is performed on the image pickup device wherein said photoelectric conversion elements are arranged so that a high-sensitive photoelectric conversion element and a low-sensitive photoelectric conversion element adjacent to said high-sensitive photoelectric conversion element in one of the line direction or the column direction have a same relative spectral sensitivity characteristic with a ratio kept substantially constant.

30. The image processing method according to claim 29, wherein the image processing method is performed on the image pickup device wherein:

each of said photoelectric conversion elements has any one of spectral sensitivities for three or four colors; and said high-sensitive photoelectric conversion elements and said low-sensitive photoelectric conversion elements are arranged in a form of color coding arrangement in which 2×2 tetragonal lattices are arranged cyclically when viewed obliquely at an angle of 45 degrees.

31. The image processing method according to claim 30, wherein the image processing method is performed on the image pickup device wherein said plurality of photoelectric conversion elements are arranged in a first line repeating pattern GrGb and a second line repeating pattern gBgR, and wherein said first and second line patterns alternate line by line, and where R, G, B are high-sensitive photoelectric conversion elements of red, green and blue colors, respectively, and r, g, b are low-sensitive photoelectric conversion elements of red, green and blue colors.

32. The image processing method according to claim 28, wherein the method is performed using the image pickup device which has the photoelectric conversion elements arranged so that the high-sensitive photoelectric conversion elements and the low-sensitive photoelectric conversion elements alternate one by one in both the line and column directions.

33. The image processing method of claim 28, wherein the solid-state image pickup device is a RGB device and the particular color is one of red, green, and blue.

34. The image processing method of claim 28, wherein the solid-state image pickup device is a CMY device and the particular color is one of cyan, magenta, and yellow.

35. An image pickup device, comprising:

a plurality of relatively high sensitivity photoelectric conversion elements arranged on a surface of a semiconductor substrate in a line direction and in a column direction substantially perpendicular to the line direction, the plurality of relatively high sensitivity photoelectric conversion elements configured to generate relatively high image signals based on color and luminance of light entering the image pickup device;

a plurality of relatively low sensitivity photoelectric conversion elements arranged on the surface of the semiconductor substrate in the line and column directions, the plurality of relatively low sensitivity photoelectric conversion elements configured to generate relatively low image signals based on the color and luminance of the light entering the image pickup device; and an image processing unit configured to generate combined image data including synthesized image data and interpolated image data based on the relatively high and the relatively low image signals, wherein for each relatively high sensitivity photoelectric conversion element sensitive to a particular color, the relatively high sensitivity photoelectric conversion element is relatively more sensitive to luminance relative to each of the relatively low sensitivity photoelectric conversion elements that are sensitive to the same particular color, and wherein the plurality of relatively high sensitivity photoelectric conversion elements are alternately placed with the plurality of relatively low sensitivity photoelectric conversion elements in the line direction or in the colunm direction or in both directions.

36. The image pickup device of claim 35, wherein the image processing unit is configured to generate the combined image data by combining each relatively high image signal of a color from a relatively high sensitivity photoelectric conversion element with the relatively low signal of the same color signal from a relatively low sensitivity photoelectric conversion element nearest to the relatively high sensitivity photoelectric conversion element for a first pixel location.

37. The image pickup device of claim 36, wherein the first pixel location is defined to be a location between the relatively high sensitivity photoelectric conversion element and the nearest relatively low sensitivity photoelectric conversion element of the same color.

38. The image pickup device of claim 36, wherein the image processing unit is configured to combine the relatively high image signal and the corresponding relatively low image signal by adding a predetermined portion of the relatively high image signal and a predetermined portion of the relatively low image signal.

39. The image pickup device of claim 38, wherein the predetermined portion of the relatively high image signal is α, the predetermined portion of the relatively low image signal is (1−α), and α ranges substantially between 0 and 1.

40. The image pickup device of claim 39, wherein α ranges substantially between 0.5 and 0.8.

41. The image pickup device of claim 36, wherein the image processing unit is configured to generate the interpolated image data by interpolating between a pair of adjacent synthesized image data of the same color for a second pixel location.

42. The image pickup device of claim 41, wherein the second pixel location is defined to be a location between the pair of adjacent first pixel locations.

43. The image pickup device of claim 35, wherein the image processing unit is configured to generate the interpolated data by generating a relatively high interpolated image signal and a relatively low interpolated image signal, wherein the image processing unit is configured to generate the relatively high interpolated image signal by interpolating between a relatively high image signal from one relatively high sensitivity photoelectric conversion element of a color and a relatively high image signal from another relatively high sensitivity photoelectric conversion element of the same color nearest to the one relatively high sensitivity photoelectric conversion element for a first pixel location in between the one and the another relatively high sensitivity photoelectric conversion elements, and wherein the image processing unit is configured to generate the relatively low interpolated image signal by interpolating between a relatively low image signal from one relatively low sensitivity photoelectric conversion element of the same color and a relatively low image signal from another relatively low sensitivity photoelectric conversion element of the same color nearest to the one relatively low sensitivity photoelectric conversion element for a second pixel location in between the one and the another relatively low sensitivity photoelectric conversion elements, not equal to the first pixel location.

44. The image pickup device of claim 43, wherein the image processing unit is configured to generate the combined image data by combining each relatively high interpolated image signal of a color with the relatively low interpolated image signal of the same color whose second pixel location is nearest to the corresponding first pixel location.

45. The image pickup device of claim 44, wherein the image processing unit is configured to combine the relatively high interpolated image signal and the corresponding relatively low interpolated image signal by adding a predetermined portion of the relatively high interpolated image signal and a predetermined portion of the relatively low interpolated image signal.

46. The image pickup device of claim 45, wherein the predetermined portion of the relatively high interpolated image signal is α, the predetermined portion of the relatively low interpolated image signal is (1−α), and α ranges substantially between 0 and 1.

47. The image pickup device of claim 46, wherein α ranges substantially between 0.5 and 0.8.

48. The image pickup device of claim 35, wherein each relatively high sensitivity photoelectric conversion element sensitive to a color is immediately adjacent to a relatively low sensitivity photoelectric conversion element sensitive to the same color in one of the line direction or in the column direction.

49. The image pickup device of claim 35, wherein the relative high sensitivity photoelectric conversion elements are arranged to alternate one by one with the low sensitivity photoelectric conversion elements in both the line and column directions.

50. The image pickup device of claim 35, wherein the solid-state image pickup device is a RGB device and the particular color is one of red, green, and blue.

51. The image pickup device of claim 35, wherein the solid-state image pickup device is a CMY device and the particular color is one of cyan, magenta, and yellow.

* * * * *